(12) United States Patent
Okubo

(10) Patent No.: US 7,911,250 B2
(45) Date of Patent: Mar. 22, 2011

(54) DELAY CIRCUIT

(75) Inventor: Junya Okubo, Kanagawa (JP)

(73) Assignee: RENESAS Electronics Corporation, Kawasaki-shi, Kanagawa (JP)

( * ) Notice: Subject to any disclaimer, the term of this patent is extended or adjusted under 35 U.S.C. 154(b) by 0 days.

(21) Appl. No.: 12/591,726

(22) Filed: Nov. 30, 2009

(65) Prior Publication Data
US 2010/0134169 A1 Jun. 3, 2010

(30) Foreign Application Priority Data
Dec. 3, 2008 (JP) .................................. 2008-308710

(51) Int. Cl.
H03H 11/26 (2006.01)

(52) U.S. Cl. ........................................ 327/263; 327/265

(58) Field of Classification Search ........... 327/263–265
See application file for complete search history.

(56) References Cited

U.S. PATENT DOCUMENTS

| 4,710,653 | A  | * | 12/1987 | Yee ................................. 327/38 |
| 7,786,782 | B2 | * | 8/2010  | Lien et al. ....................... 327/175 |
| 2004/0051569 | A1 |   | 3/2004  | Jeon |
| 2010/0109641 | A1 | * | 5/2010  | Noda et al. .................. 324/76.77 |

FOREIGN PATENT DOCUMENTS

| JP | 63-316918 | 12/1988 |
| JP | 2004-104748 | 4/2004 |

* cited by examiner

Primary Examiner — An T Luu
(74) Attorney, Agent, or Firm — McGinn IP Law Group, PLLC

(57) ABSTRACT

A delay circuit includes a ring oscillator and a control circuit. The control circuit includes an edge detector that outputs a first control signal in response to a rising edge or a falling edge of an input signal, and a counter that counts the number of pulses of an output pulse signal output from the ring oscillator and outputs a second control signal upon reaching a predetermined count number. The control circuit performs control to make the ring oscillator oscillate in response to the first control signal and to output the input signal in response to the second control signal.

11 Claims, 12 Drawing Sheets

DELAY CIRCUIT

BACKGROUND

1. Field of the Invention

The present invention relates to a delay circuit.

2. Description of Related Art

Many of control devices of double data rate (DDR) memory adjust a phase between data and strobe by using a delay locked loop (DLL) circuit in order to capture writing and reading data at both rising and falling edges of a data strobe signal. A DLL circuit is also incorporated into memory for the purpose of compensating a phase difference between an input clock and output data and establishing synchronization. One of major components of such a DLL circuit is a delay circuit.

A delay circuit is configured as a string of inverters connected in series, for example. A larger number of inverters are necessary as a delay to be obtained is larger. Further, it is necessary to mount the number of inverters large enough to obtain a desired delay even if a delay is small due to manufacturing variation in circuits or environmental variation in temperature, voltage or the like. This causes an increase in the scale of the delay circuit and thus an increase in the layout area of the delay circuit in the DLL circuit. The issue of a large proportion of the layout area of the delay circuit in the DLL circuit is pointed out in Japanese Unexamined Patent Application Publication No. 2004-104748 or the like.

With recent downscaling of semiconductor circuits, an operating speed is increasing. On the other hand, the functions incorporated into semiconductor circuits are becoming increasingly various, and not all functions have become faster. A solid state drive (SSD) control device is one such example, and a serial interface with a bandwidth of several GHz and a flash memory interface with a bandwidth of several tens to several hundreds MHz are mounted on one semiconductor integrated circuit. In order to absorb a difference in bandwidth between the serial interface and the flash memory interface, the scale of a delay circuit of the SSD control device becomes larger, which inhibits higher integration of the control device. The dominating flash memory interface is changing from a single data rate (SDR) type to a double data rate (DDR) type, and therefore a delay circuit such as a DLL is necessary. As described above, a delay circuit with a small circuit scale is required for a semiconductor circuit such as an SSD control device that is used between a high-speed interface and a low-speed interface.

A technique to address the above concern is disclosed in Japanese Unexamined Patent Application Publication No. 63-316918. FIG. 12 shows a delay circuit 1 that is disclosed in Japanese Unexamined Patent Application Publication No. 63-316918. Referring to FIG. 12, the delay circuit 1 includes an input terminal A, output terminals B1 to Bn, counters CUNT1 and CUNT2, inverters INV1 to INV6, NAND circuits NAND1 and NAND2, OR circuits OR1 to ORn, and delay flip-flops FF1 to FFn.

A high-level data input signal Din that is input to the input terminal A is input to the NAND circuit NAND1, the inverters INV3 and INV6, the delay flip-flop FF1 and the counter CUNT2. When the data input signal Din is input to the NAND circuit NAND1, a clock is generated by oscillation of a closed-loop circuit that is formed by the NAND circuit NAND1 and the inverters INV1 and INV2. The clock is input to the counter CUNT1 and counted. Before the counting operation, the reset operation of the counter CUNT1 is canceled by a low-level signal from the inverter INV3. On the other hand, the counter CUNT2 is set to the reset state by a high-level signal input to its reset terminal.

The counter CUNT1 outputs a signal from an output terminal Q1 at a specified predetermined clock number. The signal is input as a clock signal CPI to a clock input terminal of the delay flip-flop FF1 through the OR circuit OR1. In response to the clock signal CPI, the delay flip-flop FF1 captures the data input signal Din, stores it, and then outputs it as a data output signal D1out to the output terminal B1.

Then, if the data input signal Din becomes a low level, the reset operation of the counter CUNT2 is canceled. Further, by a high-level output signal from the inverter INV6, a clock is generated by oscillation of a closed-loop circuit that is formed by the NAND circuit NAND2 and the inverters INV4 and INV5. The clock is input to the counter CUNT2 and counted. On the other hand, the counter CUNT1 is set to the reset state by a high-level signal from the inverter INV3 input to its reset terminal.

The counter CUNT2 outputs a signal from its output terminal at the same predetermined clock number as the counter CUNT1. The signal is input as the clock signal CPI to the clock input terminal of the delay flip-flop FF1 through the OR circuit OR1. In response to the clock signal CPI, the delay flip-flop FF1 captures the low-level data input signal Din, stores it, and then outputs it as the data output signal D1out to the output terminal B1. In the same manner, delayed signals can be output as data output signals D2out to Dnout to the other output terminals B2 to Bn, respectively.

As described above, by combining the oscillation of the closed-loop circuit and the counter, the delay circuit 1 disclosed in Japanese Unexamined Patent Application Publication No. 63-316918 can generate a larger delay with a smaller circuit scale compared to a delay circuit composed only of inverters.

SUMMARY

However, in the above-described delay circuit 1, it is necessary that the closed-loop circuit and the counter in operation are different between the rising edge and the falling edge of the input data signal. Accordingly, two sets of the closed-loop circuits and the counters are required, and therefore the concern of a large circuit scale still remains.

An exemplary aspect of an embodiment of the present invention is a delay circuit that includes a ring oscillator and a control circuit, the control circuit including an edge detector that outputs a first control signal in response to a rising edge or a falling edge of an input signal, and a counter that counts the number of pulses of an output pulse signal output from the ring oscillator and outputs a second control signal upon reaching a predetermined count number, wherein the control circuit performs control to make the ring oscillator oscillate in response to the first control signal and to output the input signal in response to the second control signal.

In the delay circuit according to the exemplary aspect of an embodiment of the present invention, the ring oscillator oscillates at the rising edge and the falling edge of the input signal detected by the edge detector. Further, the delay circuit can delay the input signal according to the predetermined number of output pulses of the ring oscillator that are counted by the counter. This eliminates the need for different closed loop circuits for the rising edge and the falling edge of the input signal, thereby preventing an increase in circuit scale.

The delay circuit according to the exemplary aspect of an embodiment of the present invention enables suppression of an increase in circuit size.

BRIEF DESCRIPTION OF THE DRAWINGS

The above and other exemplary aspects, advantages and features will be more apparent from the following description of certain exemplary embodiments taken in conjunction with the accompanying drawings, in which.

DETAILED DESCRIPTION OF THE EXEMPLARY EMBODIMENTS

First Exemplary Embodiment

Figure 1:
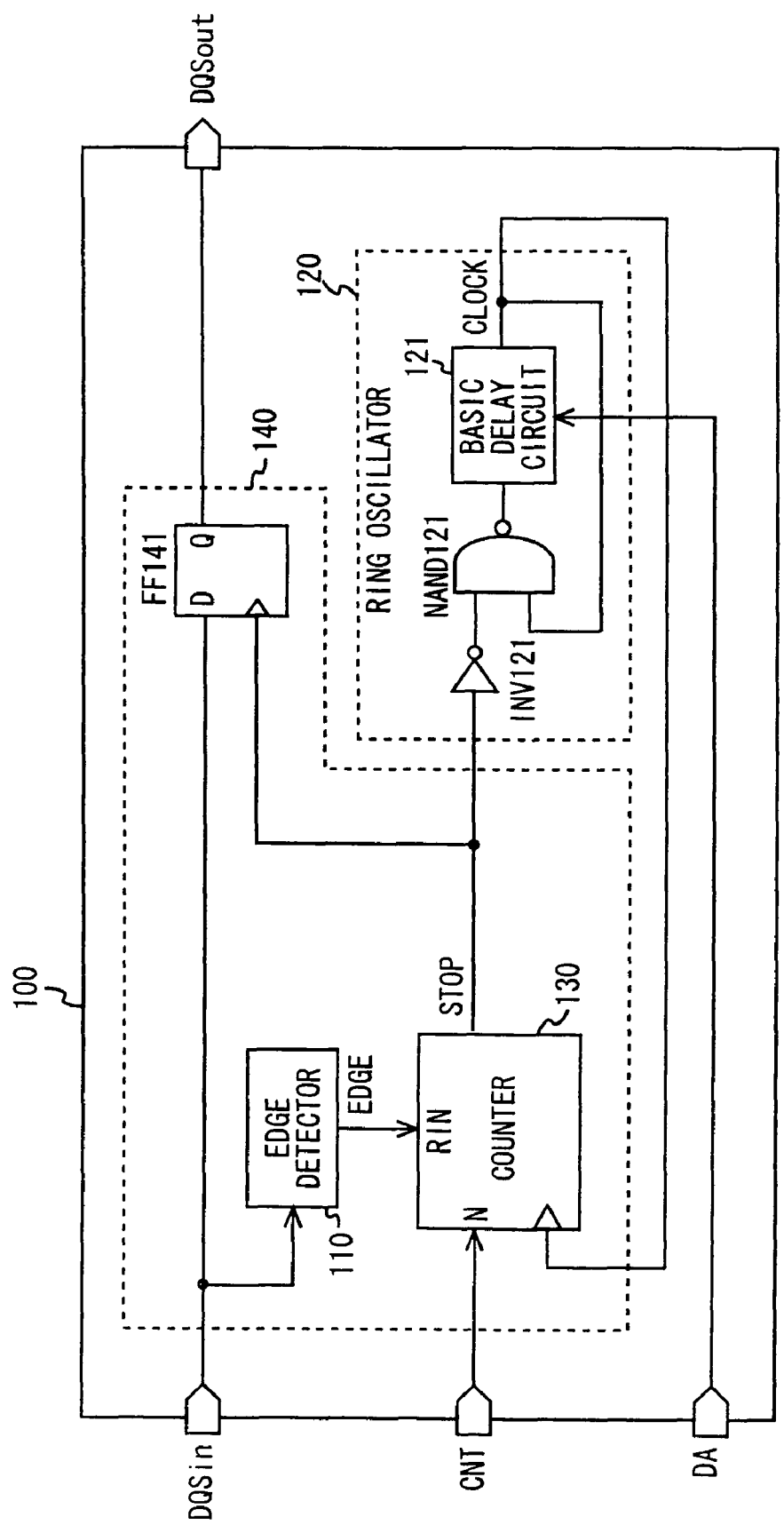
FIG. 1 shows a block configuration of a delay circuit according to a first exemplary embodiment.

A first exemplary embodiment of the present invention is described hereinafter in detail with reference to the drawings. In the first exemplary embodiment, the present invention is applied to a delay circuit of a memory interface. FIG. 1 shows an example of a configuration of a delay circuit 100 according to the first exemplary embodiment. Referring to FIG. 1, the delay circuit 100 includes an input terminal DQSin, an output terminal DQSout, a count number setting terminal CNT, a delay amount setting terminal DA, a ring oscillator 120 and a control circuit 140. The control circuit 140 includes an edge detector 110, a counter 130 and a flip-flop FF141. A signal input to the input terminal DQSin is referred to as a data strobe signal DQSin, and a signal output from the output terminal DQSout is referred to as a data strobe signal DQSout.

The input terminal DQSin is a terminal to which the data strobe signal DQSin having a bandwidth with a frequency of several tens to several hundreds MHz, for example, is input.

The output terminal DQSout is a terminal from which the data strobe signal DQSout having a bandwidth with a frequency of several tens to several hundreds MHz, for example, is output. The data strobe signal DQSout is generated by adding a desired delay to the data strobe signal DQSin in the delay circuit 100.

Figure 2:
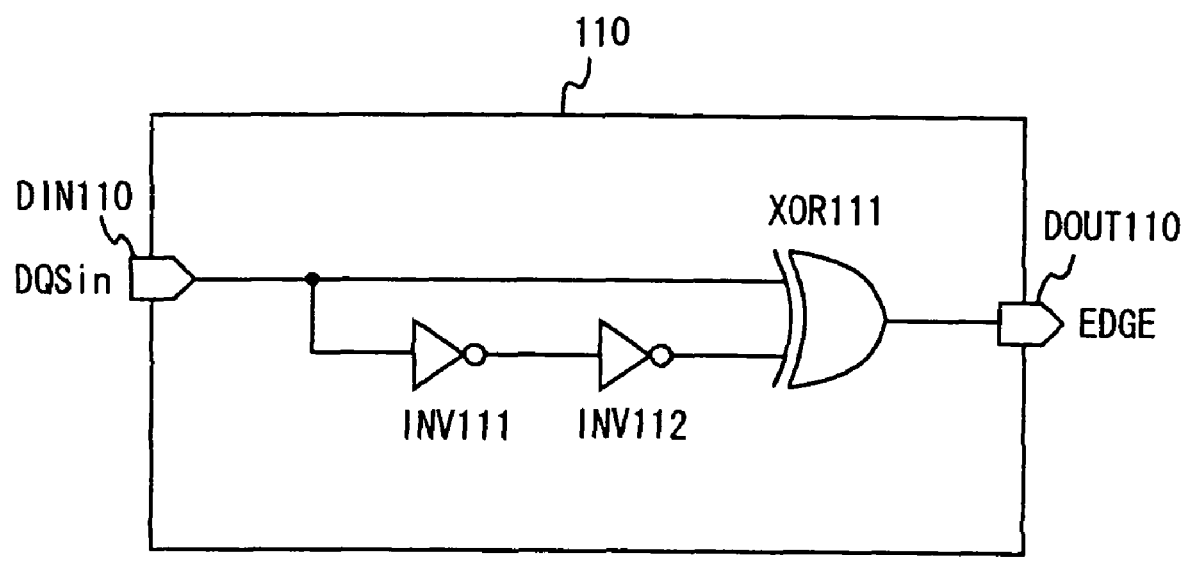
FIG. 2 shows a configuration of an edge detector according to the first exemplary embodiment.

The edge detector 110 detects rising and falling edges of the input signal DQSin and outputs a control signal EDGE. A configuration of the edge detector 110 is described hereinafter in detail with reference to the drawing. FIG. 2 shows an example of a configuration of the edge detector 110. Referring to FIG. 2, the edge detector 110 includes an input terminal DIN110, an output terminal DOUT110, inverters INV111 and INV112, and an exclusive OR circuit XOR111. The data strobe signal DQSin is input to the input terminal DIN110. An input terminal of the inverter INV111 is connected to the input terminal DIN110. An input terminal of the inverter INV112 is connected to an output terminal of the inverter INV111. One input terminal of the exclusive OR circuit XOR111 is connected to the input terminal DIN110, the other input terminal is connected to an output terminal of the inverter INV112, and an output terminal of the exclusive OR circuit XOR111 is connected to the output terminal DOUT110.

As shown in FIG. 2, the inverters INV111 and INV112 are connected in series and form an inverter string. The inverter string adds a predetermined delay to the input data strobe signal DQSin and outputs the delayed signal. Thus, the exclusive OR circuit XOR111 outputs a pulse signal having a width corresponding to a delay difference between the output signal containing the delay from the inverter string and the data strobe signal DQSin. The pulse signal is output both at the rising edge and the falling edge of the data strobe signal DQSin input to the input terminal DIN110. The output terminal DOUT110 outputs the pulse signal that is output from the exclusive OR circuit XOR111 as the control signal EDGE (first control signal). The number of inverters forming the inverter string is not limited to two, and it may be a multiple number as long as it is an even number. The pulse width of the control signal EDGE can be adjusted by the even number of inverters.

If the control signal EDGE from the edge detector 110 is input to a reset terminal RIN of the counter 130, the reset state is cancelled, and the counter 130 starts counting. Specifically, if the rising edge of the control signal EDGE is input, the counter 130 resets the count value to "0", cancels the reset at the falling edge and starts counting. Concurrently, the counter 130 outputs a low-level control signal STOP. If the reset state is cancelled, the counter 130 counts a clock signal CLOCK from the ring oscillator 120 up to a predetermined value. Specifically, the counter 130 counts the rising edge of the clock signal CLOCK. In the counter 130, an upper limit N (N is a positive integer) of the count is set according to a setting signal (second setting signal) that is input to a setting terminal N. When the count reaches the upper limit N, the counter 130 outputs a high-level control signal STOP (second control signal). The control signal STOP that is output from the counter 130 is input to a clock input terminal of the flip-flop FF141. The setting terminal N of the counter 130 is connected to the count number setting terminal CNT, and a setting signal N from the count number setting terminal CNT is input to the setting terminal N.

A data input terminal D of the flip-flop FF141 is connected to the input terminal DQSin, and a data output terminal Q of the flip-flop FF141 is connected to the output terminal DQSout. Further, the control signal STOP from the counter 130 is input to the clock input terminal of the flip-flop FF141. In response to the rising edge of the control signal STOP, the flip-flop FF141 latches the data input to the data input terminal D and outputs it to the data output terminal Q.

Figure 3:
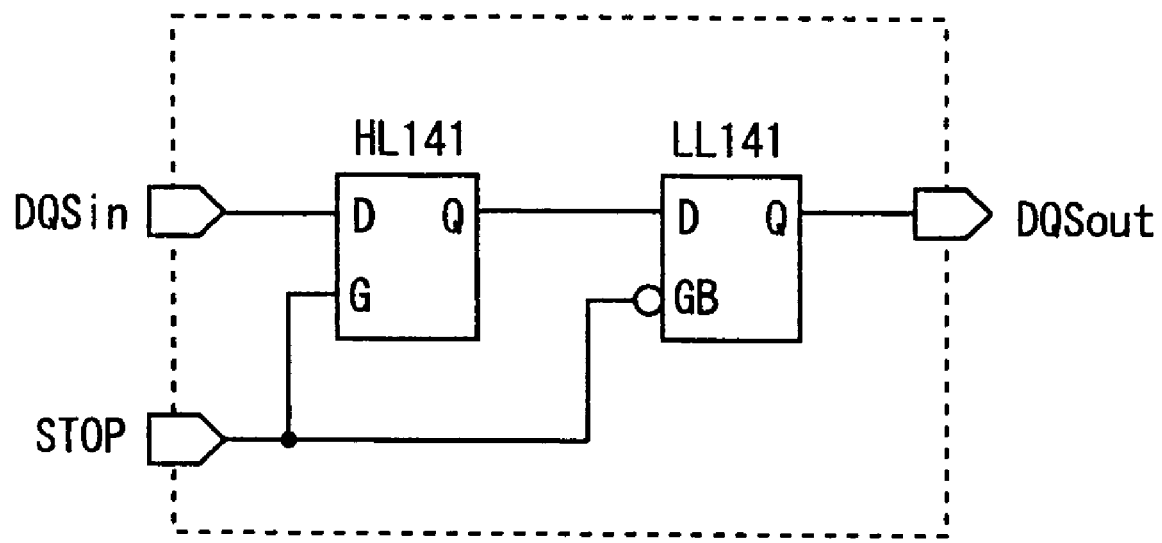
FIG. 3 shows an example of a configuration of an alternate circuit of a flip-flop of a control circuit according to the first exemplary embodiment.

Instead of the flip-flop FF141, the control circuit 140 may include a circuit composed of a high-through latch circuit HL141 and a low-through latch circuit LL142 as shown in FIG. 3. In this case, a data input terminal D of the high-through latch circuit HL141 is connected to the input terminal DQSin, and a data output terminal Q of the high-through latch circuit HL141 is connected to a data input terminal D of the low-through latch circuit LL142. The data input terminal D of the low-through latch circuit LL142 is connected to the data output terminal Q of the high-through latch circuit HL141, and a data output terminal Q of the low-through latch circuit LL142 is connected to the output terminal DQSout. Further, the control signal STOP is input to a control terminal G of the high-through latch circuit HL141 and a control terminal GB of the low-through latch circuit LL142. With use of the circuit configuration of FIG. 3, instead of the flip-flop FF141, the control circuit 140 can equally perform signal processing.

Figure 4:
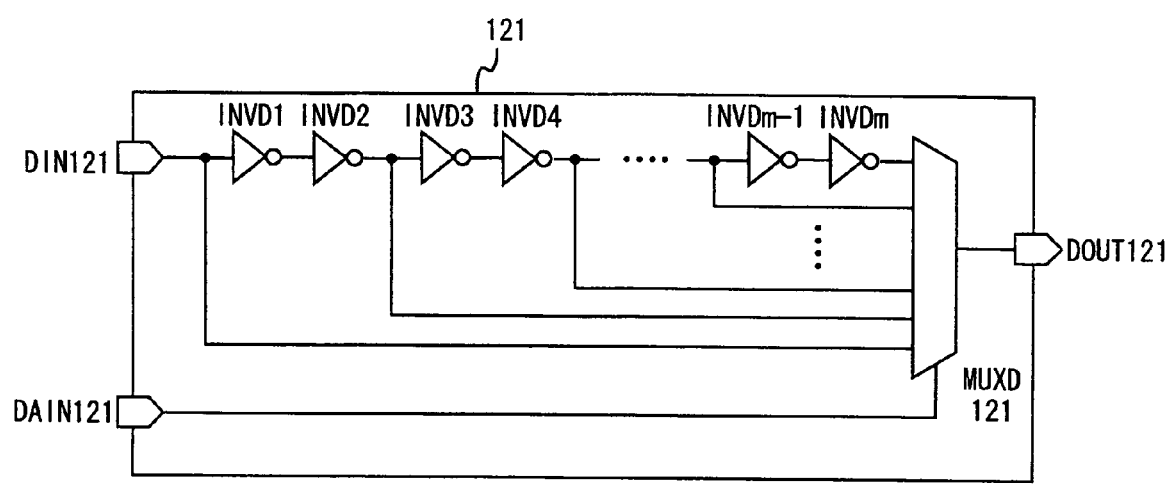
FIG. 4 shows an example of a configuration of a digitally controlled ring oscillator according to the first exemplary embodiment.

The ring oscillator 120 includes an inverter INV121, a NAND circuit NAND121 and a basic delay circuit 121. A circuit configuration of the basic delay circuit 121 is described hereinafter in detail with reference to the drawing. It is assumed that the delay circuit 100 according to the first exemplary embodiment is a variable delay circuit in which the signal delay amount is controllable. The delay amount may be set in an analog or digital manner. FIG. 4 shows a configuration of the basic delay circuit 121 in the case where the delay circuit 100 is a digital circuit. Referring to FIG. 4, the basic delay circuit 121 includes an input terminal DIN121, an output terminal DOUT121, a delay amount control terminal DAIN121, inverters INVD1 to INVDm (m is an even number of two or above), and a multiplexer MUXD121. The inverters INVD1 to INVDm are connected in series between the input terminal DIN121 and the multiplexer MUXD121. An input terminal of the inverter INVD1 is connected to the input terminal DIN121, and an output terminal of the inverter INVDm is connected to one input terminal of the multiplexer MUXD121. A signal input to the input terminal DIN121 is transferred with a delay through the inverters INVD1 to INVDm.

The multiplexer MUXD121 (selector) includes a plurality of input terminals and a selection control terminal. The respective input terminals of the multiplexer MUXD121 are connected to the input terminal DIN121 and respective output terminals of the inverters INVD2, INVD4, INVD6, ..., INVDm−2 and INVDm. Thus, delayed signals that are sequentially delayed with respect to the signal input to the input terminal DIN121 are respectively input to the plurality of input terminals of the multiplexer MUXD121.

The multiplexer MUXD121 selects one of the signals input to the plurality of input terminals according to a value of a digital signal (first setting signal) that is input to the selection control terminal and outputs the selected signal. The selection control terminal is connected to the delay amount control terminal DAIN121. The delay amount control terminal DAIN121 is further connected to the delay amount setting terminal DA. Thus, the amount of delay given to the signal by the basic delay circuit 121 is determined according to the digital signal input to the delay amount setting terminal DA.

Figure 5:
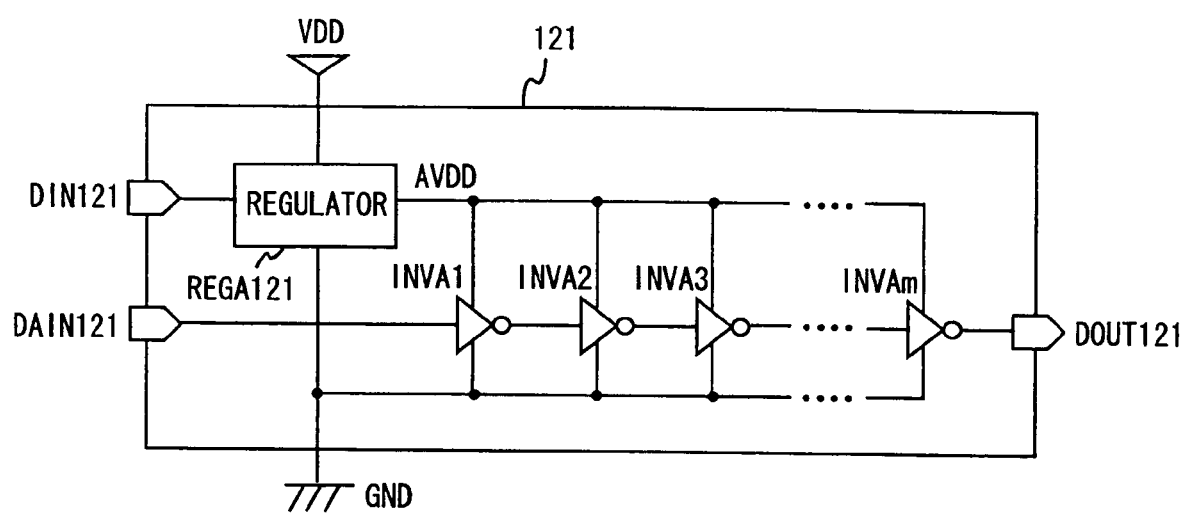
FIG. 5 shows an example of a configuration of an analogue controlled ring oscillator according to the first exemplary embodiment.

FIG. 5 shows a configuration of the basic delay circuit 121 in the case where the delay circuit 100 is an analog circuit. Referring to FIG. 5, the basic delay circuit 121 includes an input terminal DIN121, an output terminal DOUT121, a delay amount control terminal DAIN121, inverters INVA1 to INVAm (m is an even number of two or above), and a regulator REGA121. The inverters INVA1 to INVAm are connected in series between the input terminal DIN121 and the output terminal DOUT121. An input terminal of the inverter INVA1 is connected to the input terminal DIN121, and an output terminal of the inverter INVAm is connected to the output terminal DOUT121. A signal input to the input terminal DIN121 propagates with a delay through the inverters INVA1 to INVAm. A power supply voltage of the inverters INVA1 to INVAm is a voltage AVDD that is supplied from the regulator REGA121.

The regulator REGA121 is a variable voltage regulator and supplies the voltage AVDD corresponding to an analog signal from the delay amount control terminal DAIN121 to the inverters INVA1 to INVAm. By controlling a value of the voltage AVDD, the delay amount of the signal propagating through the inverters INVA1 to INVAm can be controlled. For example, if a value of the voltage AVDD is high, the delay of the signal propagating through the inverters INVA1 to INVAm is small. On the contrary, if a value of the voltage AVDD is low, the delay of the signal propagating through the inverters INVA1 to INVAm is large. The delay amount control terminal DAIN121 is further connected to the delay amount setting terminal DA. Thus, the delay amount of the signal propagating through the inverters INVA1 to INVAm is determined by an analog signal (first setting signal) input to the delay amount setting terminal DA.

The inverter INV121 receives the control signal STOP by its input terminal and outputs an inverted signal of the control signal STOP to one input terminal of the NAND circuit NAND121. One input terminal of the NAND circuit NAND121 is connected to an output terminal of the inverter INV121, the other input terminal is connected to the output terminal DOUT121 of the basic delay circuit 121, and an output terminal of the NAND circuit NAND121 is connected to the input terminal DIN121 of the basic delay circuit 121.

If the control signal STOP is a low level, the inverter INV121 outputs a high level, which is an inverted signal. Therefore, the NAND circuit NAND121 outputs an inverted signal of the signal input to the other input terminal to the basic delay circuit 121. An output signal from the basic delay circuit 121 is input to the other input terminal of the NAND circuit NAND121. Thus, the NAND circuit NAND121 and the basic delay circuit 121 form a closed loop circuit, and oscillation is started. By the oscillation, a series of pulse signals are output from the basic delay circuit 121. The pulse signal is referred to hereinafter as a clock signal CLOCK. The oscillation frequency of the clock signal CLOCK that is output from the basic delay circuit 121 is adjusted or controlled according to a delay set amount that is input from the delay amount setting terminal DA.

On the other hand, if the control signal STOP is a high level, the inverter INV121 outputs a low-level signal to the NAND circuit NAND121. Thus, the NAND circuit NAND121 outputs only a high-level signal to the basic delay circuit 121 regardless of whether an output from the basic delay circuit 121 is a high level or a low level. Accordingly, the closed loop circuit that is formed by the basic delay circuit 121 and the NAND circuit NAND121 does not oscillate. As a result, the basic delay circuit 121 does not output the above-described clock signal CLOCK and keeps the signal output to a high level.

Figure 6:
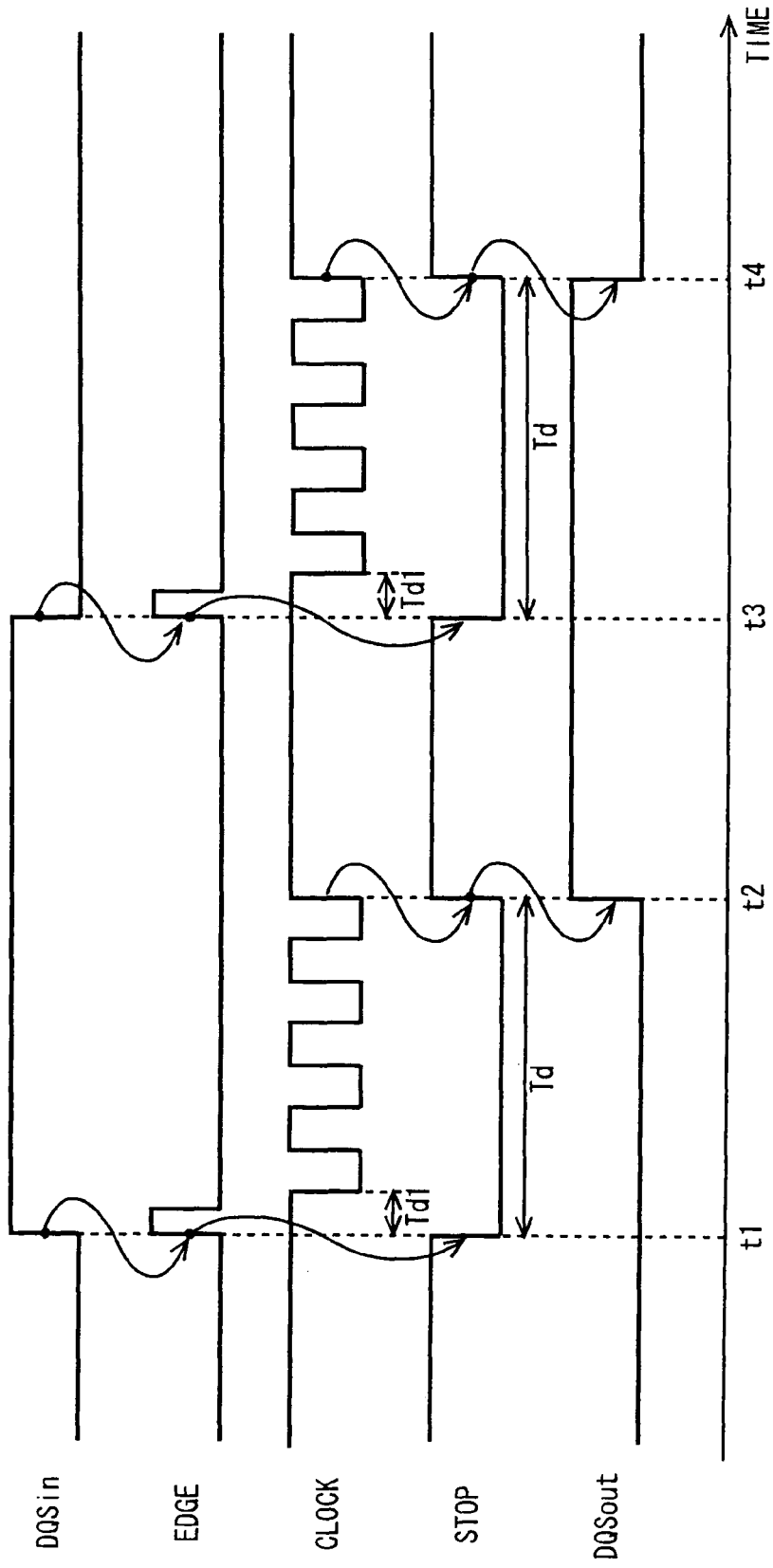
FIG. 6 is a timing chart showing an operation of the delay circuit according to the first exemplary embodiment.

An operation of the delay circuit 100 having the above-described configuration is described hereinafter in detail with reference to the drawing. It is assumed that the counter 130 counts "four" clocks according to the setting signal from the count number setting terminal CNT. FIG. 6 shows a timing chart of an operation of the delay circuit 100. First, at time t1, the data strobe signal DQSin rises from a low level to a high level. In response thereto, the edge detector 110 outputs the control signal EDGE having a given pulse width to the reset terminal RIN of the counter 130. In response to the control signal EDGE, the counter 130 causes the control signal STOP to fall from a high level (first status value) to a low level (second status value).

When the control signal EDGE is input, the counter 130 starts counting. Further, the ring oscillator 120 starts oscillating and outputs the clock signal CLOCK. The clock signal CLOCK is output from the ring oscillator 120 after about a half cycle Td1 of the clock signal CLOCK from the time t1.

Next, at time t2, the counter 130 has counted the rising edge of the clock signal CLOCK four times, and causes the control signal STOP to rise from a low level to a high level. In response to the rising edge, the flip-flop FF141 latches and outputs the data strobe signal DQSin. The data strobe signal DQSout thereby rises to a high level. Concurrently, the high-level control signal STOP is input to the ring oscillator 120. Consequently, the ring oscillator 120 stops oscillating and ceases to output the clock signal CLOCK. A period Td from the time t1 to t2 corresponds to a value obtained by multiplying a value (2Td1) that is twice the half cycle Td1 of the clock signal CLOCK by a value N (N=4 in this example) of the setting signal from the count number setting terminal CNT. Thus, Td=(2Td1)×N (N is a positive integer).

Then, at time t3, the data strobe signal DQSin falls from a high level to a low level. In response thereto, the edge detector 110 outputs the control signal EDGE having a given pulse width to the reset terminal RIN of the counter 130. In response to the control signal EDGE, the counter 130 causes the control signal STOP to fall from a high level to a low level. When the low-level control signal EDGE is input, the ring oscillator 120 starts oscillating again and outputs the clock signal CLOCK. The clock signal CLOCK is output from the ring oscillator 120 after about a half cycle Td1 of the clock signal CLOCK from the time t3.

After that, at time t4, the counter 130 has counted the rising edge of the clock signal CLOCK four times, and causes the control signal STOP to rise from a low level to a high level. In response to the rising edge, the flip-flop FF141 latches and outputs the data strobe signal DQSin. The data strobe signal DQSout thereby falls to a low level. A period from the time t3 to t4 corresponds to a value obtained by multiplying a value (2Td1) that is twice the half cycle Td1 of the clock signal CLOCK by a value N of the setting signal from the count number setting terminal CNT. Thus, Td=(2Td1)×N, as in the period from the time t1 to t2. Accordingly, the data strobe signal DQSout has a delay of the period (2Td1)×N with respect to the signal DQSin. At the time t4, the high-level control signal STOP is input to the ring oscillator 120. Thus, the ring oscillator 120 stops oscillating and ceases to output the clock signal CLOCK.

The delay circuit 1 according to Japanese Unexamined Patent Application Publication No. 63-316918, which is prior art, includes two systems of delay generation circuits for the rising edge (NAND1, INV1 to INV3 and CUNT1) and the falling edge (NAND2, INV4 to INV6 and CUNT2) of the input signal, which operate alternately. While one delay generation circuit is operating, the other delay generation circuit is in a ready state for the next signal processing. The delay circuit 1 having such a configuration has the following problems. First, because the delay circuit 1 includes the two delay generation circuits for the rising edge and the falling edge, the circuit scale is large. Further, the output signal is easily affected by manufacturing variation of elements of the two delay generation circuits. Specifically, the output signal is easily affected by a relative error between the rising edge and the falling edge of the input signal, which causes a delay difference between the rising edge and the falling edge of the output signal, that is, deterioration of a duty ratio of the output signal. Furthermore, because the closed loop circuit serving as a ring oscillator of either one delay generation circuit is always oscillating, power consumption is high.

On the other hand, in the delay circuit 100 according to the first exemplary embodiment, the edge detector 110 detects the rising edge and the falling edge of the input signal (data strobe signal DQSin). The detection result triggers the counting of the counter 130 and the oscillation of the ring oscillator 120. Further, when the clock signal from the ring oscillator 120 reaches a predetermined value, the counter 130 outputs the control signal STOP. In response to the control signal STOP, the ring oscillator 120 stops oscillating and automatically enters a ready state for the next operation.

As described above, the delay circuit 100 implements the same operation as the delay circuit 1 with only one system of delay generation circuit for the rising edge and the falling edge. It is therefore possible to suppress an increase in circuit scale, which is the problem of the delay circuit 1. Further, the delay circuit 100 is not affected by manufacturing variation of elements, which is caused by the use of two systems of delay generation circuits. Furthermore, the delay circuit 100 stops the oscillation of the ring oscillator after delaying the rising edge and the falling edge of the input signal (data strobe signal DQSin) by a specified predetermined length of period. It is thereby possible to reduce power consumption and enable lower power consumption of the circuit.

Second Exemplary Embodiment

Figure 7:
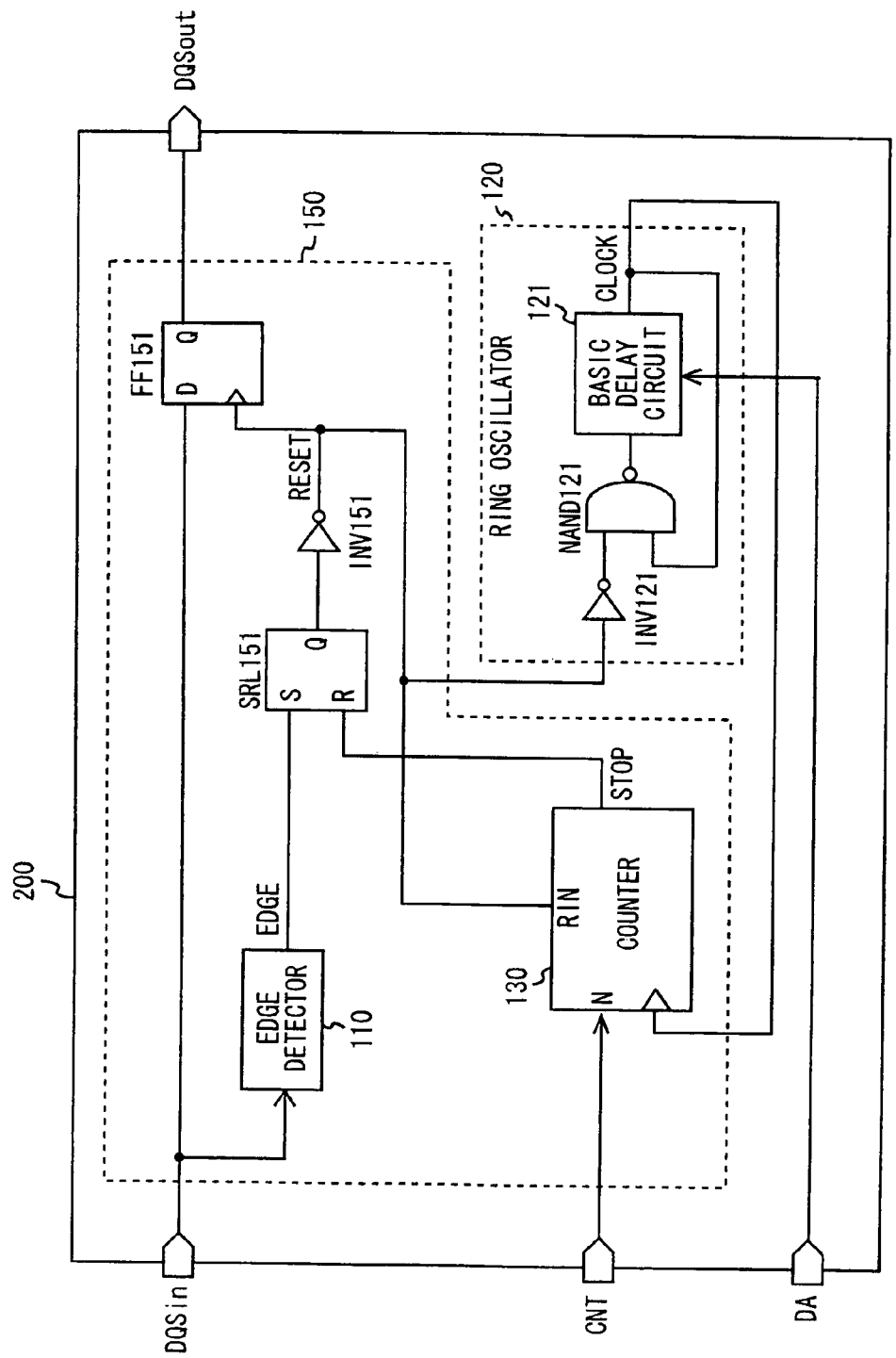
FIG. 7 shows a block configuration of a delay circuit according to a second exemplary embodiment.

A second exemplary embodiment of the present invention is described hereinafter in detail with reference to the drawings. In the second exemplary embodiment, like the first exemplary embodiment, the present invention is applied to a delay circuit of a memory interface. FIG. 7 shows an example of a configuration of a delay circuit 200 according to the second exemplary embodiment. Referring to FIG. 7, the delay circuit 200 includes an input terminal DQSin, an output terminal DQSout, a count number setting terminal CNT, a delay amount setting terminal DA, a ring oscillator 120 and a control circuit 150. The control circuit 150 includes an edge detector 110, a counter 130, a flip-flop FF151, a latch circuit SRL151 and an inverter INV151. In FIG. 7, the elements denoted by the same reference symbols as those in FIG. 1 have the same or similar configuration as the equivalents in FIG. 1. The second exemplary embodiment is different from the first exemplary embodiment in the configuration of the control circuit 150, a part of the function of the counter 130 and a connection among the components. In the second exemplary embodiment, the differences are mainly described.

Figure 8:
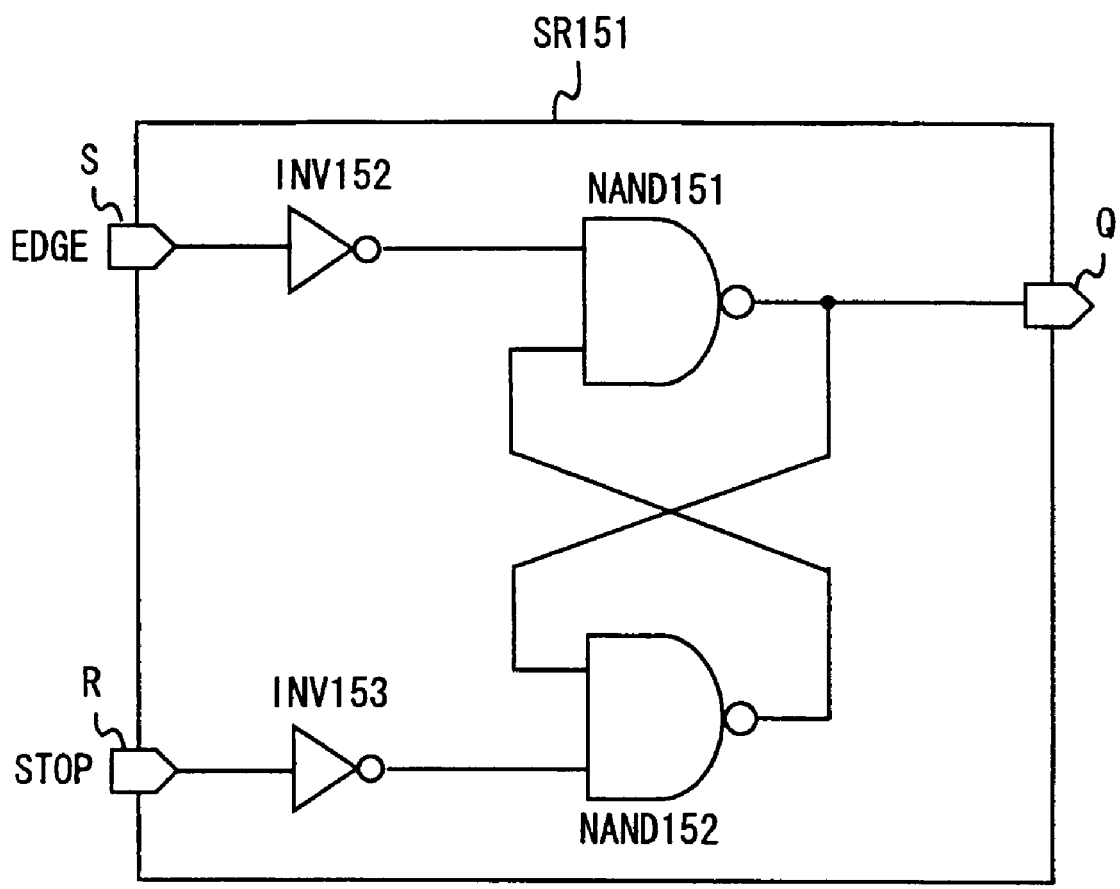
FIG. 8 shows a configuration of a latch circuit in a control circuit according to the second exemplary embodiment.

FIG. 8 shows a circuit configuration of the latch circuit SRL151. Referring to FIG. 8, the latch circuit SRL151 includes a set terminal S, a reset terminal R, an output terminal Q, inverters INV152 and INV153, and NAND circuits NAND151 and NAND152.

The control signal EDGE from the edge detector 110 is input to the set terminal S. The control signal STOP from the counter 130 is input to the reset terminal R. An input terminal of the inverter INV152 is connected to the set terminal S, and an output terminal of the inverter INV152 is connected to one input terminal of the NAND circuit NAND151. An input terminal of the inverter INV153 is connected to the reset terminal R, and an output terminal of the inverter INV153 is connected to one input terminal of the NAND circuit NAND152. One input terminal of the NAND circuit NAND151 is connected to the output terminal of the inverter INV152, the other input terminal is connected to an output terminal of the NAND circuit NAND152, and an output terminal of the NAND circuit NAND151 is connected to the output terminal Q. One input terminal of the NAND circuit NAND152 is connected to the output terminal of the inverter INV153, the other input terminal is connected to the output terminal Q, and an output terminal of the NAND circuit NAND152 is connected to the other input terminal of the NAND circuit NAND151.

The latch circuit SRL151 (control signal generation circuit) is an RS latch circuit. The output terminal Q outputs a status value (output signal level) of the latch circuit SRL151. The latch circuit SRL151 controls the status value according to a value of a signal (input signal level) that is input to the set terminal S and the reset terminal R. Specifically, when a high-level pulse signal is input to the set terminal S, the latch circuit SRL151 sets the status value to a high level. On the other hand, when a high-level pulse signal is input to the reset terminal R, the latch circuit SRL151 sets the status value to a low level. If a signal of the same level is input to the set terminal S and the reset terminal R, the level of the set terminal S is output preferentially.

In the flip-flop FF151, the data input terminal D is connected to the input terminal DQSin, the data output terminal Q is connected to the output terminal DQSout, and the clock input terminal is connected to the output terminal of the inverter INV151.

In the inverter INV151, an input terminal is connected to the output terminal Q of the latch circuit SRL151, and an output terminal is connected to the clock input terminal of the flip-flop FF151, the reset terminal RIN of the counter 130 and the inverter INV121 of the ring oscillator 120. A signal that is output from the inverter INV151 is referred to as a control signal RESET (third control signal).

When a low-level signal is input to the reset terminal RIN, the counter 130 counts a clock signal input to the clock input terminal. In the counter 130, an upper limit N of the count is set according to a setting signal that is input to a setting terminal N, which is a setting signal from the count number setting terminal CNT, as in the first exemplary embodiment. When the count reaches the upper limit N, the counter 130 outputs a pulse signal having a given pulse width as a control signal STOP. The control signal STOP is input to the reset terminal R of the latch circuit SRL151. Further, an input terminal of the inverter INV121 of the ring oscillator 120 is connected to an output terminal of the inverter INV151 of the control circuit 150. The other elements are the same as those in the first exemplary embodiment and thus not redundantly described.

Figure 9:
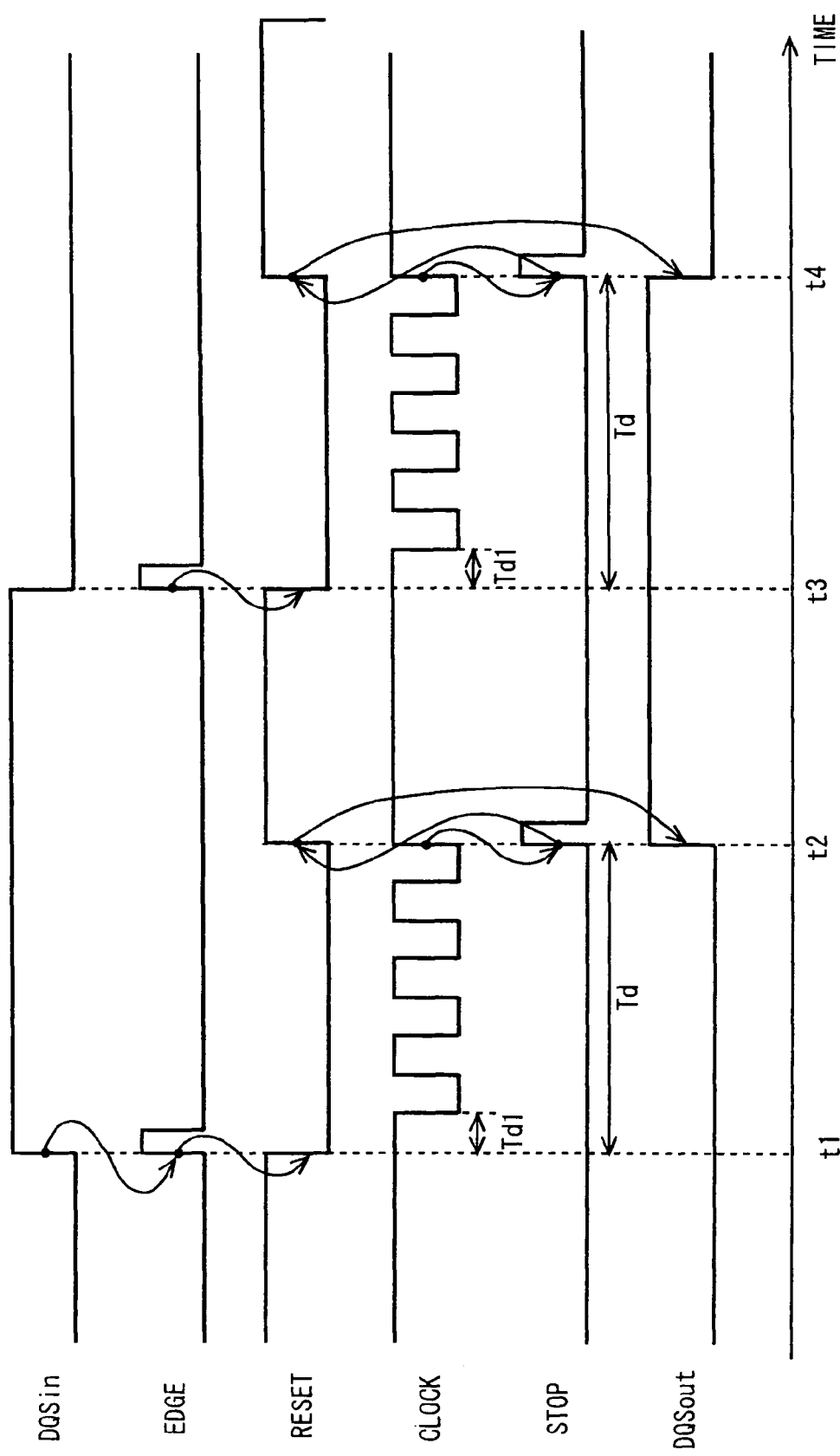
FIG. 9 is a timing chart showing an operation of the delay circuit according to the second exemplary embodiment.

An operation of the delay circuit 200 having the above-described configuration is described hereinafter in detail with reference to the drawing. It is assumed that the counter 130 counts "four" clocks according to the setting signal from the count number setting terminal CNT. FIG. 9 shows a timing chart of an operation of the delay circuit 200. First, at time t1, the data strobe signal DQSin rises from a low level to a high level. In response thereto, the edge detector 110 outputs the control signal EDGE having a given pulse width to the set terminal S of the latch circuit SRL151. In response to the control signal EDGE, the latch circuit SRL151 causes a signal output from the output terminal Q to rise from a low level to a high level. The inverter INV151 inverts the phase of the signal output from the latch circuit SRL151 and outputs a low-level control signal RESET to the flip-flop FF151, the counter 130 and the ring oscillator 120.

When the low-level control signal RESET is input, the counter 130 starts counting. Further, the ring oscillator 120 starts oscillating and outputs the clock signal CLOCK. The clock signal CLOCK is output from the ring oscillator 120 after about a half cycle Td1 of the clock signal CLOCK from the time t1, which is the same as in the first exemplary embodiment.

Next, at time t2, the counter 130 has counted the rising edge of the clock signal CLOCK four times, and then outputs the control signal STOP having a given pulse width. In response to the control signal STOP, the latch circuit SRL151 causes the signal output from the output terminal Q to fall from a high level to a low level. The inverter INV151 causes the control signal RESET to rise from a low level to a high level so as to invert the phase of the signal output from the output terminal Q. The control signal RESET is output to the flip-flop FF151, the counter 130 and the ring oscillator 120. Because the control signal RESET rises from a low level to a high level, the flip-flop FF151 of the control circuit 150 latches and outputs the data strobe signal DQSin. The data strobe signal DQSout thereby rises to a high level. Further, the counter 130 stops counting. Furthermore, the ring oscillator 120 stops oscillating and ceases to output the clock signal CLOCK.

A period Td from the time t1 to t2 corresponds to a value obtained by multiplying a value (2Td1) that is twice the half cycle Td1 of the clock signal CLOCK by a value N (N=4 in this example) of the setting signal from the count number setting terminal CNT, which is the same as in the first exemplary embodiment. Thus, Td=(2Td1)×N (N is a positive integer).

Then, at time t3, the data strobe signal DQSin falls from a high level to a low level. In response thereto, the edge detector 110 outputs the control signal EDGE having a given pulse width to the set terminal S of the latch circuit SRL151. In response to the control signal EDGE, the latch circuit SRL151 causes the signal output from the output terminal Q to rise from a low level to a high level. The inverter INV151 inverts the phase of the signal output from the latch circuit SRL151 and outputs a low-level control signal RESET to the flip-flop FF151, the counter 130 and the ring oscillator 120.

When the low-level control signal RESET is input, the counter 130 starts counting again. Further, the ring oscillator 120 starts oscillating again and outputs the clock signal CLOCK.

After that, at time t4, the counter 130 has counted the rising edge of the clock signal CLOCK four times, and then outputs the control signal STOP having a given pulse width. In response to the control signal STOP, the latch circuit SRL151 causes the signal output from the output terminal Q to fall from a high level to a low level. The inverter INV151 causes the control signal RESET to rise from a low level to a high level so as to invert the phase of the signal output from the output terminal Q. The control signal RESET is output to the flip-flop FF151, the counter 130 and the ring oscillator 120. Because the control signal RESET rises from a low level to a high level, the flip-flop FF151 of the control circuit 150 latches and outputs the data strobe signal DQSin. The data strobe signal DQSout thereby falls to a low level. Further, the counter 130 stops counting. Furthermore, the ring oscillator 120 stops oscillating and ceases to output the clock signal CLOCK. A period from the time t3 to t4 corresponds to a value obtained by multiplying a value (2Td1) that is twice the half cycle Td1 of the clock signal CLOCK by a value N of the setting signal from the count number setting terminal CNT. Thus, Td=(2Td1)×N, as in the period from the time t1 to t2. Accordingly, the data strobe signal DQSout has a delay of the period (2Td1)×N with respect to the signal DQSin.

In the delay circuit 200 having the above-described configuration, a pulse width that is input to the reset terminal RIN of the counter 130 can be larger than that in the delay circuit 100 according to the first exemplary embodiment. This has an advantage of easier circuit design of the delay circuit 200 including the counter 130.

Third Exemplary Embodiment

Figure 10:
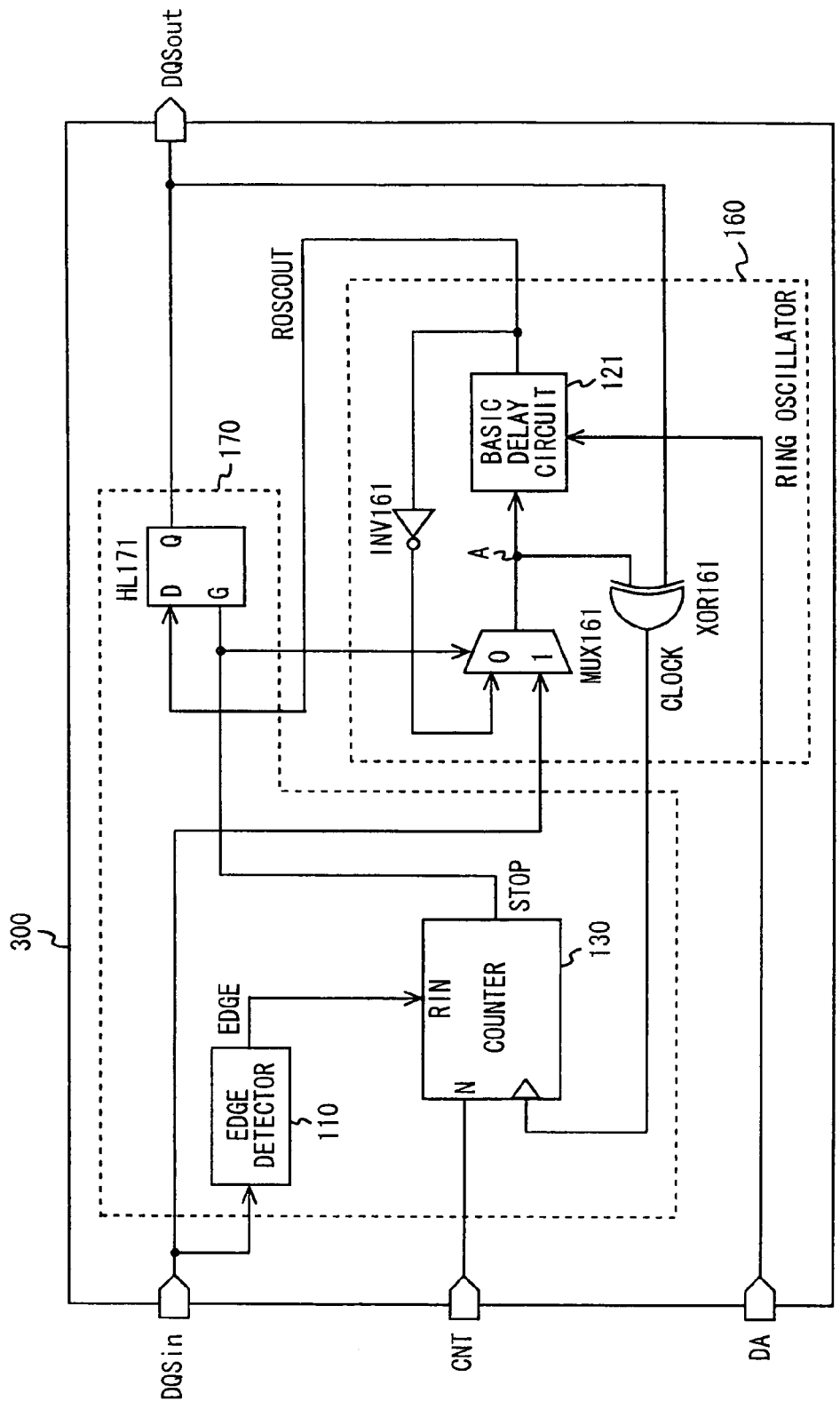
FIG. 10 shows a block configuration of a delay circuit according to a third exemplary embodiment.

A third exemplary embodiment of the present invention is described hereinafter in detail with reference to the drawings. In the third exemplary embodiment, like the first exemplary embodiment, the present invention is applied to a delay circuit of a memory interface. FIG. 10 shows an example of a configuration of a delay circuit 300 according to the third exemplary embodiment. Referring to FIG. 10, the delay circuit 300 includes an input terminal DQSin, an output terminal DQSout, a count number setting terminal CNT, a delay amount setting terminal DA, a ring oscillator 160 and a control circuit 170. The control circuit 170 includes an edge detector 110, a counter 130, and a high-through latch circuit HL171. In FIG. 10, the elements denoted by the same reference symbols as those in FIG. 1 have the same or similar configuration as the equivalents in FIG. 1. The third exemplary embodiment is different from the first exemplary embodiment in the configuration of the control circuit 160 and the control circuit 170 and a connection among the components. In the third exemplary embodiment, the differences are mainly described.

Referring to FIG. 10, the ring oscillator 160 includes a basic delay circuit 121, a multiplexer MUX161, an inverter INV161, and an exclusive OR circuit XOR161. One data input terminal of the multiplexer MUX161 is connected to the inverter INV161, the other data input terminal is connected to the input terminal DQSin, and a data output terminal of the multiplexer MUX161 is connected to a node A. The multiplexer MUX161 selects a signal of one of the two data input terminals according to a value of the control signal STOP from the counter 130 and outputs the selected signal to the node A. Specifically, the multiplexer MUX161 selects a signal of one data input terminal when the control signal STOP is a low level and selects a signal of the other data input terminal when the control signal STOP is a high level, and outputs the selected signal to the node A.

An input terminal of the inverter INV161 is connected to the output terminal DOUT121 of the basic delay circuit 121, and an output terminal of the inverter INV161 is connected to one data input terminal of the multiplexer MUX161. The basic delay circuit 121 has the same circuit configuration as that in the first exemplary embodiment. However, the output terminal DOUT121 is connected to the input terminal of the inverter INV161 and a data input terminal D of the high-through latch circuit HL171. Further, the input terminal DIN121 is connected to the node A.

Therefore, when the control signal STOP is a low level, the inverter INV161 and the basic delay circuit 121 form a closed loop circuit, and oscillation is started. A pulse signal that is output from the output terminal DOUT121 of the basic delay circuit 121 by the oscillation is referred to as ROSCOUT. On the other hand, when the control signal STOP is a high level, the data strobe signal DQSin is input, a predetermined delay is added thereto, and the delayed signal is output to the high-through latch circuit HL171.

One input terminal of the exclusive OR circuit XOR161 is connected to the node A, the other input terminal is connected to the output terminal DQSout, and an output terminal of the exclusive OR circuit XOR161 is connected to the clock input terminal of the counter 130. Thus, the exclusive OR circuit XOR161 does not invert or inverts the signal at the node A, which is the signal before input to the basic delay circuit 121, according to the level of the output terminal DQSout and outputs the signal. Specifically, when the output signal DQSout is a low level, the exclusive OR circuit XOR161 outputs a non-inverted signal of the signal at the node A. On the other hand, when the output signal DQSout is a high level, the exclusive OR circuit XOR161 outputs an inverted signal of the signal at the node A. A pulse signal that is output from the output terminal of the exclusive OR circuit XOR161 is referred to as the clock signal CLOCK.

The data input terminal D of the high-through latch circuit HL171 is connected to the output terminal DOUT121 of the basic delay circuit 121, and a data output terminal Q of the high-through latch circuit HL171 is connected to the output terminal DQSout. Further, the control signal STOP from the counter 130 is input to a control terminal G of the high-through latch circuit HL171. The other elements are the same as those in the first exemplary embodiment and thus not redundantly described.

Figure 11:
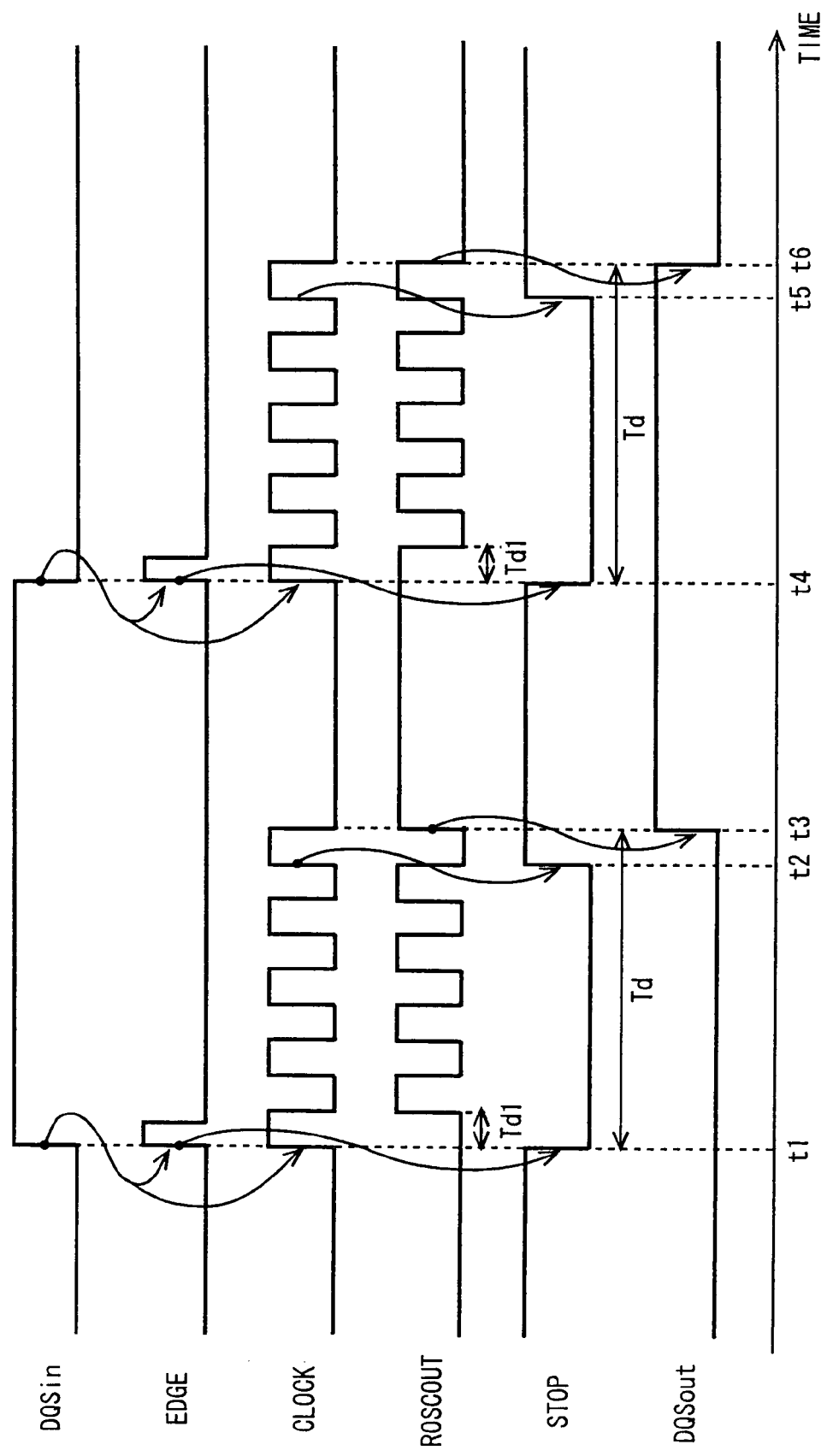
FIG. 11 is a timing chart showing an operation of the delay circuit according to the third exemplary embodiment.
Figure 12:
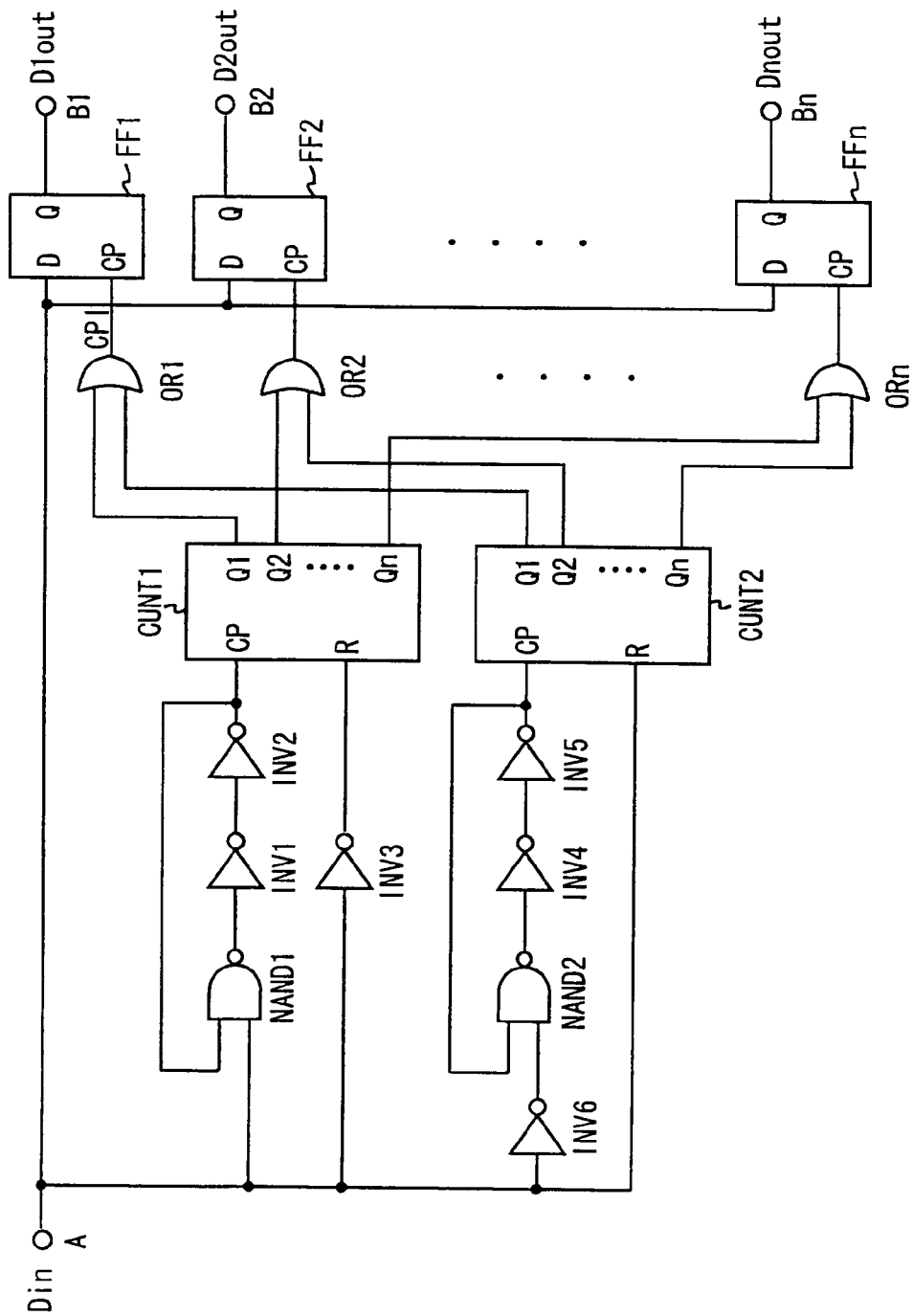
FIG. 12 shows a configuration of a delay circuit according to prior art.

An operation of the delay circuit 300 having the above-described configuration is described hereinafter in detail with reference to the drawing. It is assumed that the counter 130 counts "four" clocks according to the setting signal from the count number setting terminal CNT. FIG. 11 shows a timing chart of an operation of the delay circuit 300.

First, at time t1, the data strobe signal DQSin rises from a low level to a high level. In response thereto, the edge detector 110 outputs the control signal EDGE having a given pulse width to the reset terminal RIN of the counter 130. When the control signal EDGE is input, the counter 130 resets the count value and then starts counting. Further, the counter 130 causes the control signal STOP to fall from a high level to a low level.

In response to the low-level control signal STOP, the multiplexer MUX161 of the ring oscillator 160 selects a signal from the inverter INV161 and outputs it to the node A. The inverter INV161 and the basic delay circuit 121 thereby form a closed loop circuit, and oscillation is started. By the oscillation, the pulse signal ROSCOUT is output from the basic delay circuit 121. The pulse signal ROSCOUT is output to the node A from the multiplexer MUX161 through the inverter INV161. Further, the pulse signal ROSCOUT is input to the data input terminal D of the high-through latch circuit HL171. Because the control signal STOP that is input to the control terminal G is a low level, the high-through latch circuit HL171 maintains a low-level output. Thus, the pulse signal ROSCOUT is not output to the output terminal DQSout. The pulse signal ROSCOUT is output from the ring oscillator 160 after about a half cycle Td1 of a pulse frequency of the pulse signal ROSCOUT from the time t1.

At this time, a low-level signal from the high-through latch circuit HL171 is input to the other input terminal of the exclusive OR circuit XOR161. Accordingly, a non-inverted (positive-phase) signal of the signal at the node A that is input to one input terminal of the exclusive OR circuit XOR161 is output as a clock signal CLOCK from the ring oscillator 160. The clock signal CLOCK is input to the clock input terminal of the counter 130. The rising edge of the clock signal CLOCK that is input at the time 1, however, reaches the counter 130 before canceling the reset and thus not counted.

Next, at time t2, the counter 130 has counted the rising edge of the clock signal CLOCK four times, and then causes the control signal STOP to rise from a low level to a high level. The high-level control signal STOP is input to the control terminal of the multiplexer MUX161 and the control terminal G of the high-through latch circuit HL171. Thus, the multiplexer MUX161 selects a signal from the input terminal DQSin and outputs it to the node A. At this time, the above-described closed loop circuit ceases to be formed, and oscillation is stopped. Accordingly, the basic delay circuit 121 and the high-through latch circuit HL171 both serve as through circuits. A high-level signal that is input from the input terminal DQSin is delayed by the basic delay circuit 121 and output (hereinafter, the signal is referred to as a through signal). The delay time is about a half cycle Td1 of a pulse frequency of the pulse signal ROSCOUT. Time after the period Td1 from the time t2 is time t3. At the time t3, the high-through latch circuit HL171 outputs the high-level through signal that is input to the data input terminal D. The data strobe signal DQSout thereby rises to a high level.

A period Td from the time t1 to t3 is Td=Td1×(2(N+1)) (N is a positive integer) where Td1 is a half cycle of the clock signal CLOCK and N is a value of a setting signal from the count number setting terminal CNT.

Then, at time t4, the data strobe signal DQSin falls from a high level to a low level. In response thereto, the edge detector 110 outputs the control signal EDGE having a given pulse width to the reset terminal RIN of the counter 130. When the control signal EDGE is input, the counter 130 starts counting and causes the control signal STOP to fall from a high level to a low level at the same time, just like at the time 1.

In response to the low-level control signal STOP, the multiplexer MUX161 of the ring oscillator 160 selects a signal from the inverter INV161 and outputs it to the basic delay circuit 121. The inverter INV161 and the basic delay circuit 121 thereby form a closed loop circuit again, and oscillation is restarted. By the oscillation, the pulse signal ROSCOUT is output from the basic delay circuit 121. The pulse signal ROSCOUT is output to the node A from the multiplexer MUX161 through the inverter INV161.

At this time, the high-through latch circuit HL171 outputs the high-level data strobe signal DQSout. The high-level signal is input to the other input terminal of the exclusive OR circuit XOR161. Accordingly, an inverted (negative-phase) signal of the signal at the node A that is input to one input terminal of the exclusive OR circuit XOR161 is output as a clock signal CLOCK from the ring oscillator 160. The pulse signal ROSCOUT is output from the ring oscillator 160 after about a half cycle Td1 of a pulse frequency of the pulse signal ROSCOUT from the time t4.

After that, at time t5, the counter 130 has counted the rising edge of the clock signal CLOCK four times, and causes the control signal STOP to rise from a low level to a high level. The high-level control signal STOP is input to the control terminal of the multiplexer MUX161 and the control terminal G of the high-through latch circuit HL171. Thus, the multiplexer MUX161 selects a signal from the input terminal DQSin and outputs it to the node A. The above-described closed loop circuit thereby ceases to be formed, and oscillation is stopped. Accordingly, the basic delay circuit 121 and the high-through latch circuit HL171 both serve as through circuits again. A low-level signal that is input from the input terminal DQSin is delayed by the basic delay circuit 121 and output. The delay time is about a half cycle Td1 of a pulse frequency of the pulse signal ROSCOUT. Time after the period Td1 from the time t5 is time t6. At the time t6, the high-through latch circuit HL171 outputs the low-level through signal that is input to the data input terminal D. The data strobe signal DQSout thereby falls to a low level. A period from the time t4 to t6 is Td=Td1×(2(N+1)), just like the period from the time t1 to t3. As described above, the data strobe signal DQSout has a delay of the period Td1×(2(N+1)) with respect to the signal DQSin.

In the delay circuit 300 having the above-described configuration, it is possible to minimize a delay different from the basic delay circuit 121, which is an intrinsic delay of the delay circuit 300, that is contained in a propagation delay from the input terminal DQSin to the output terminal DQSout compared to the delay circuit 100 according to the first exemplary embodiment.

The first to third exemplary embodiments can be combined as desirable by one of ordinary skill in the art.

While the invention has been described in terms of several exemplary embodiments, those skilled in the art will recognize that the invention can be practiced with various modifications within the spirit and scope of the appended claims and the invention is not limited to the examples described above.

Further, the scope of the claims is not limited by the exemplary embodiments described above.

Furthermore, it is noted that, Applicant's intent is to encompass equivalents of all claim elements, even if amended later during prosecution.

What is claimed is:

1. A delay circuit comprising:
   a ring oscillator; and
   a control circuit, the control circuit including:
      an edge detector that outputs a first control signal in response to a rising edge or a falling edge of an input signal; and
      a counter that counts the number of pulses of an output pulse signal output from the ring oscillator and outputs a second control signal upon reaching a predetermined count number, wherein
   the control circuit performs control to make the ring oscillator oscillate in response to the first control signal and to output the input signal in response to the second control signal.

2. The delay circuit according to claim 1, wherein the ring oscillator includes a basic delay circuit that controls a pulse width of the output pulse signal according to a first setting signal.

3. The delay circuit according to claim 2, wherein
   the basic delay circuit includes:
      m-number (m is an even number) of inverters that are connected in series to transfer an input signal by sequentially delaying the signal; and
      a selector that selects any one of sequentially delayed signals and outputs the selected signal, and
   selection by the selector is performed according to the first setting signal being a digital signal.

4. The delay circuit according to claim 2, wherein
   the basic delay circuit includes:
      m-number (m is an even number) of inverters that are connected in series to transfer an input signal by sequentially delaying the signal; and
      a power supply circuit that supplies a power supply voltage of the inverters, and
   the power supply voltage supplied from the power supply circuit is controlled according to the first setting signal being an analog signal.

5. The delay circuit according to claim 1, wherein
   the control circuit further includes a flip-flop that latches and outputs the input signal when the second control signal changes from a second status value to a first status value,
   the counter changes the second control signal to the second status value in response to the first control signal and outputs the second control signal having the first status value when the number of pulses of the output pulse signal reaches a predetermined count number, and
   the ring oscillator outputs the output pulse signal when the second control signal has the second status value.

6. The delay circuit according to claim 5, wherein the ring oscillator stops outputting the output pulse signal when the second control signal has the first status value.

7. The delay circuit according to claim 1, wherein
   the control circuit further includes:

a flip-flop that latches and outputs the input signal when a third control signal changes from a second status value to a first status value; and a control signal generation circuit that changes the third control signal to the first status value in response to the first control signal and changes the third control signal to the second status value in response to the second control signal, the ring oscillator outputs the output pulse signal when the third control signal has the second status value, and the counter counts the number of pulses of the output pulse signal when the third control signal has the second status value.

8. The delay circuit according to claim 7, wherein the ring oscillator stops outputting the output pulse signal when the third control signal has the first status value.

9. The delay circuit according to claim 2, wherein the counter changes the second control signal to a second status value in response to the first control signal and outputs the second control signal having a first status value when the number of pulses of the output pulse signal reaches the predetermined count number, the ring oscillator outputs the output pulse signal when the second control signal has the second status value, and stops outputting the output pulse signal and inputs the input signal to the basic delay circuit when the second control signal has the first status value, and the control circuit includes a latch circuit that latches the input signal through the basic delay circuit when the second control signal has the first status value.

10. The delay circuit according to claim 2, wherein the predetermined count number counted by the counter is set according to a second setting signal, and a delay period of the input signal delayed by the delay circuit is determined according to the first setting signal and the second setting signal.

11. The delay circuit according to claim 1, wherein the edge detector includes:

a string of even number of inverters that are connected in series; and an exclusive OR circuit that generates the first control signal, and the exclusive OR circuit receives the input signal and the input signal having passed through the string of inverters.

* * * * *